United States Patent [19]

Shafer

[11] 4,091,392
[45] May 23, 1978

[54] SKEW CORRECTION

[75] Inventor: Donald E. Shafer, Littleton, Colo.

[73] Assignee: Honeywell Inc., Minneapolis, Minn.

[21] Appl. No.: 753,716

[22] Filed: Dec. 23, 1976

[51] Int. Cl.² ............................................. G01D 9/04
[52] U.S. Cl. .................................... 346/110 R; 315/9; 346/35
[58] Field of Search ............... 346/45, 49, 110 R, 136, 346/35; 315/393, 392, 9; 178/15, 30

[56] References Cited

U.S. PATENT DOCUMENTS

| | | | |
|---|---|---|---|
| 3,289,196 | 11/1966 | Hull | 346/110 R X |
| 3,434,158 | 3/1969 | Stauffer | 346/110 R |
| 3,482,255 | 12/1969 | Baker | 346/110 R |
| 3,808,535 | 4/1974 | Weddleton | 346/35 X |

*Primary Examiner*—Joseph W. Hartary
*Attorney, Agent, or Firm*—Laurence J. Marhoefer; Lockwood D. Burton

[57] ABSTRACT

In a twin tube recording CRT system, apparatus is provided for accurately aligning the line scan trace of the two tubes with respect to each other. The positioning voltage applied to the vertical deflection plates of the two tubes is compared in a comparator network. When a substantial identity of the compared signals is detected by the comparator network, suitable indicating devices, such as LED's, are actuated to indicate the proper alignment, without the need for visual reference to the face of the tubes. There is also provided an interrelated skew correction circuit for the two tubes wherein a sample-and-hold circuit samples the skew correction signal for the first tube at a selected point in the sweep thereof. That sampled signal is superimposed on the skew correction signal for the second tube, to effect an offset of that skew correction signal by the amount of the sampled signal of the first tube skew correction signal. That offset produces an effective continuation of the skew correction signal across the face of the two tubes.

5 Claims, 7 Drawing Figures

SKEW CORRECTION

BACKGROUND OF THE INVENTION

1. Field of the Invention

This invention relates to wide scan oscillographic recording apparatus.

2. Description of the Prior Art

Oscillographic devices suitable for wide scan recording are known in the prior art. Typically, the recording media are light or heat sensitive, or depend upon the formation of electrostatic charges on the medium. The marking means may include cathode ray pin type and other similar recording tubes. An example of a line scan type oscillographic recording apparatus is shown in U.S. Pat. No. 3,434,158 in which a cathode ray tube having a fiber-optics face is used to produce an electron beam having a predominant wave length which strikes a recording medium that is ultrasensitive to that wave length. The recording medium is moved transversely of the fiber-optics face while the cathode ray tube electron beam is deflected in responsive to an input signal to be recorded. Exposure of the recording medium to the radiation from the electron beam forms a recording trace thereon. Such apparatus provides high speed continuous recording of input signals which may be high or low in frequency and which immediately become visible upon the recording medium.

A disadvantage of such prior oscillographic recorders, particularly where wide scan recording, for example, in excess of 5 inches, is desired is the cost and structural weakness of the large size fiber-optics cathode ray tube that is required, and the cost also the attendant power supply and insulation needed.

An alternative to such wide scan oscillographic recorders is shown in U.S. Pat. No. 3,289,196, Hull, in which two normally blanked fiber-optic cathode ray tubes are positioned side by side and are selectively unblanked for recording on adjacent portions of the same recording medium. The cathode ray tubes are horizontally slaved in a manner such that their electron beams are successively swept, in sequence, across the recording medium. This action closely simulates the operation of a single cathode ray tube of substantially larger size. This result is achieved without requiring the use of large, structurally weak, and expensive recording tubes and the expensive high voltage power supply and insulation needed for such large size tubes.

While effective for the purpose, the side by side cathode ray tube arrangement has left something to be desired from the standpoint of initial calibration of the apparatus, specifically the accurate positioning of the line scan between the two fiber-optic cathode tubes. This calibration adjustment has required viewing the cathode ray tube displays while effecting the necessary adjustments of the associated electronic circuitry. Since the recording medium covers the faceplate and fiber-optics strips of the cathode ray tubes when the apparatus is set up for recording, this has precluded checking the alignment of the line scan between the plurality of fiber-optics cathode ray tubes just prior to effecting a recording operation.

Further, the above-noted Hull patent is directed to the display and recording of alphanumeric characters across the face of the two tubes or alphanumerics on one tube and a related analog trace on the other tube. Thus, another shortcoming of the known prior art is the recognition of a need for a skew correction which carries over from one tube to the other to correct for the skew which would be incident to the continuous movement of the recording medium while the trace is being effected.

SUMMARY OF THE INVENTION

Accordingly, it is an object of the present invention to provide an improved wide scan recording apparatus having a plurality of fiber-optics cathode ray tubes positioned side by side whereby wide scan recording is achieved without requiring the use of high cost, structurally weak, large size cathode ray or pin type tubes and their attendant disadvantages, and in which accurate positioning of the line scan between the plurality of fiber-optics cathode ray tubes can be achieved without viewing the cathode ray tube displays.

It is another object of the present invention to provide an improved wide scan recording apparatus as set forth and featuring an improved skew correction for the system.

In accomplishing this and other objects, the apparatus of the present invention includes a novel circuit combination to sense when the vertical trace positions of the cathode ray tubes are the same, whereupon a suitable indication, for example, the lighting of a light emitting diode (LED) provided on the front panel of the apparatus, gives a visual indication of accurate alignment of the line scan between the cathode ray tubes. Specifically, the circuitry includes operational amplifiers that may be adjusted to compensate for the differences in deflection factors of the cathode ray tubes. The outputs of the amplifiers will then be identical when the vertical trace positions are the same. A comparator included in the circuitry senses this identity and energizes the LED to provide the visual front panel indication.

Further, the apparatus of the present invention includes a skew correction circuit for each of the two channels, the skew correction circuits being correlated to the speed at which the recording medium is being driven. The two skew correction circuits are so interconnected that the skew of the first channel is carried over to the other channel whereby the skew appears continuous.

BRIEF DESCRIPTION OF THE DRAWINGS

A better understanding of the present invention may be had from the following detailed description when read in the light of the accompanying drawings in which.

DETAILED DESCRIPTION

Figure 1:
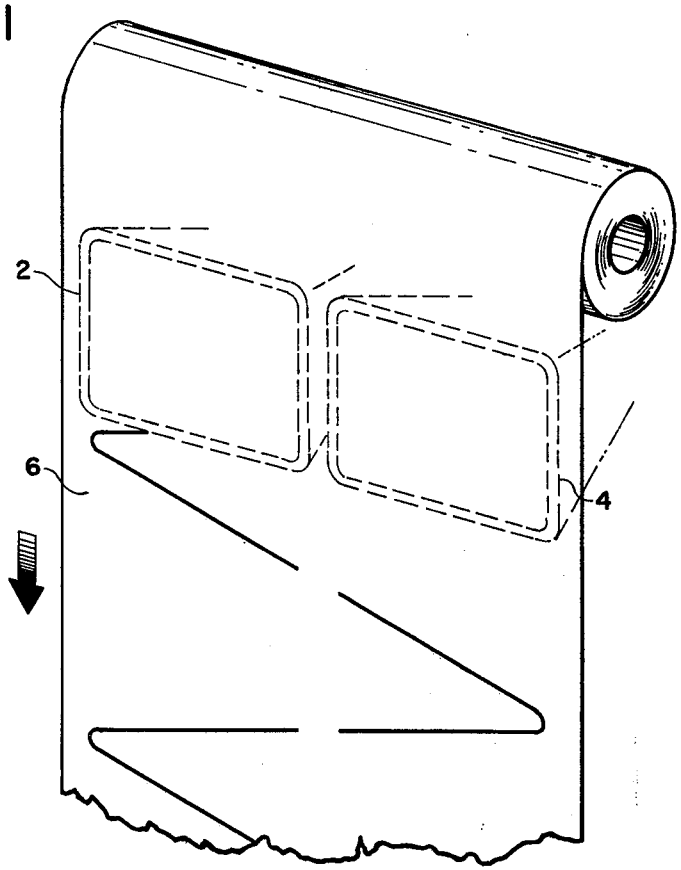
FIG. 1 is a schematic representation of recording apparatus including two fiber-optics cathode ray tubes arranged in association with a common recording medium.

In FIG. 1, there is shown a recording system illustrative of the type of recording apparatus to which the present invention relates. A first and a second fiber-optics cathode ray tube 2 and 4, respectively, are positioned side by side in as close proximity as is practicable. A roll of a suitable recording medium 6 is so positioned that the recording medium may be drawn across the face of the two CRT's 2 and 4 whereby light trace images produced at the face of the two CRT's will be recorded on the recording medium 6. In one mode of recording, it is contemplated that an analog signal would be applied in such manner to the control elements of the two CRT's that the resulting trace 8 will extend substantially across the full width of the recording medium and embracing the combined capability of the two CRT's 2 and 4. Techniques for accomplishing recording of data by two side by side CRT's are known in the art and are shown here for establishing the environment for the present invention.

Figure 2:
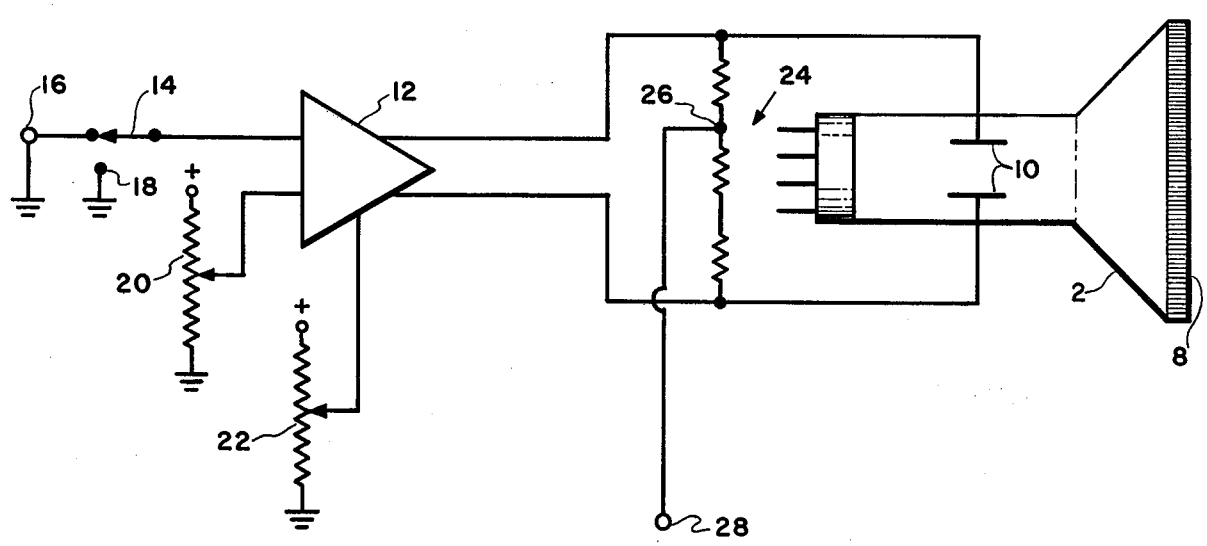
FIG. 2 is a schematic diagram of a basic circuit for adjusting the initial position of the scanning beam in the CRT.

In FIG. 2, there is shown a circuit for initially positioning the base line of a scan trace, or line scan, of the cathode beam on the face of the CRT. It will, of course, be recognized that each of the two CRT's of the system will have a similar circuit arrangement; the one circuit shown is illustrative of both circuits. The CRT 2 has a fiber-optic faceplate 8 constructed in a known manner. There is also provided suitable deflection plates for deflecting the cathode ray beam across the face of the faceplate 8, the two vertical deflection plates 10 being here illustrated. Signals are supplied to the plates 10 from the differential output of a vertical amplifier 12. When a signal response vertical deflection is to be applied to the CRT, one input of the amplifier 12 is connected by way of a switch 14 to an input terminal 16. On the other hand, if the CRT is to be operated in a so-called line scan mode, the switch 14 will be connected to a grounded terminal 18. With the switch 14 connected to the grounded terminal 18, no deflectional signal is applied to the deflection plates 10 through the amplifier 12. Therefore under such circumstances, a trace produced on the face of the cathode ray tube would be a horizontal line, a so-called line scan mode. In such a mode, the data signals may be applied either to the horizontal deflection or to a beam intensity control, either of which may be operated to effect a recording of the desired data.

Figure 3:
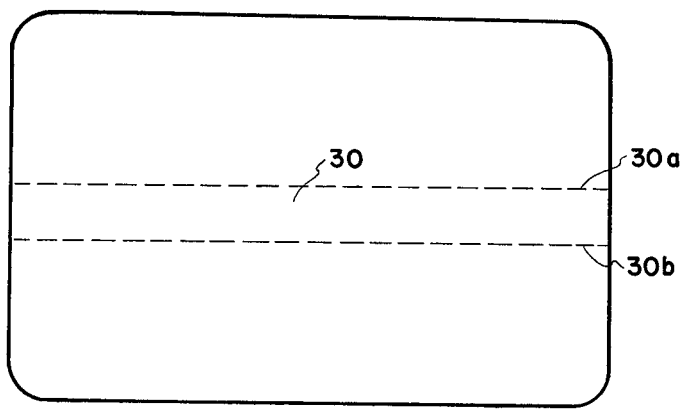
FIG. 3 is a schematic view of the faceplate of the CRT and will be helpful in understanding aspects of the present invention.

If but a single tube were being used as a recording instrument, it would be adequate to generally center the vertical deflection of the beam with respect to the face of the tube. When two tubes are being used in the manner herein set forth, if the composite signal is to be a meaningful trace, it is necessary that the trace of the two tubes be accurately aligned with respect to each other. To this end, there is provided, in the apparatus shown in FIG. 2, a first slidewire resistor 20 which provides a course adjustment of the positioning of the beam with respect to the faceplate 8 of the CRT 2. As will be seen in connection with the description of the circuit of FIG. 4, the coarse adjustment along the slidewire 20 is used to initially center the CRT beam within the limits of a narrow band that extends across the long dimension of the faceplate 8. In apparatus constructed in accordance with the present invention, each of the CRT's have a faceplate which was approximately 3 inches high by 5 inches wide. In such an environment, the coarse adjustment to the band across the middle of the CRT extending parallel to the long dimension thereof was arbitrarily set at 1 cm. in width and is referred to herein as the center centimeter. There is also provided a second slidewire resistor 22, adjustments along which are used to effect a fine adjustment of the positioning of the beam of the CRT within the center centimeter. A voltage dividing resistance string 24 is connected across the output leads from the vertical amplifier 12, that is, across the deflection plates 10. A tap connection 26 nearest the upper plate of the plates 10 connected along that resistance string 24 produces a signal at a terminal 28 which is used for a comparison of the signals applied to the vertical deflection plates of the two tubes during alignment adjustments, as will be seen in the description in connection with FIG. 4. In FIG. 3, the center centimeter is illustrated by the dotted band 30 having an upper limit 30a and a lower limit 30b.

Figure 4:
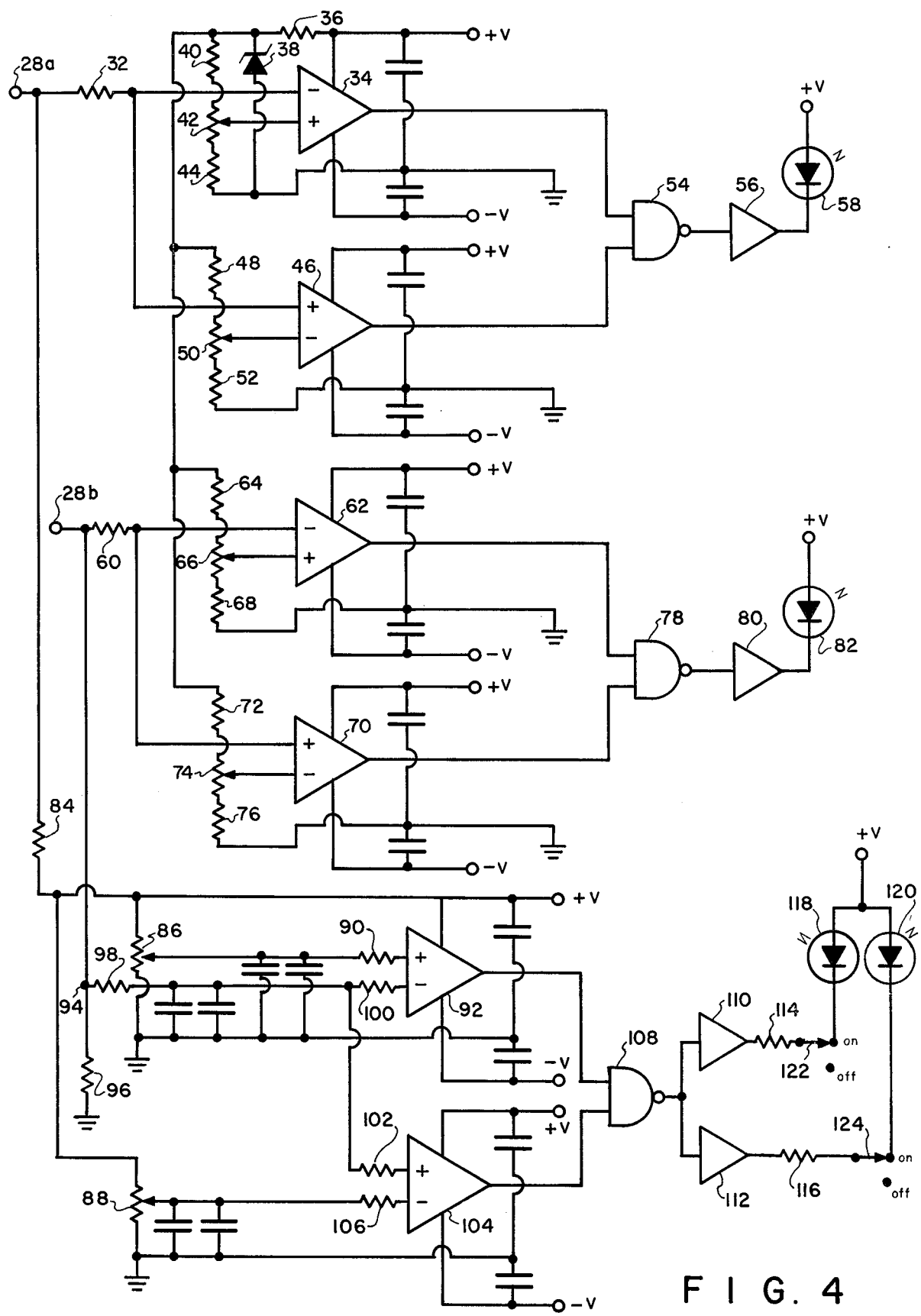
FIG. 4 is a schematic diagram of a circuit embodying aspects of the present invention.

With reference, now, to FIG. 4, there is shown a first input terminal 28a which corresponds, for channel 1, to the connecting terminal 28 of FIG. 2. There is also shown a second input terminal 28b which corresponds, for the channel 2 CRT, to the terminal 28 of FIG. 2. The terminal 28a is connected through a coupling resistor 32 to a first input terminal of a comparator amplifier 34. A positive voltage supply is connected first to energize the comparator 34, then, through a resistor 36 to a zener diode 38, the other side of which is connected to ground. The zener diode 38 provides a stable reference voltage source thereacross. A voltage dividing network composed of a first, second and third resistors 40, 42 and 44, respectively, is connected across the zener diode 38. The resistor 42 is a slidewire resistor, a tap on which provides an adjustable bias voltage for the other input terminal of the comparator 34. The terminal 28a is also connected through the resistor 32 to the first input terminal of a second comparator amplifier 46. A second voltage dividing resistor string, composed of resistors 48, 50 and 52, is connected across the zener diode 38. Again, the resistor 50 is a slidewire resistor having an adjustable tap thereon connected to the other input terminal of the comparator amplifier 46. This provides an adjustable reference or bias signal for the second comparator amplifier 46. The output terminal of the first comparator amplifier 34 is connected to one input terminal of a two input NAND gate 54. The output terminal of the second comparator amplifier 46 is connected to the other input terminal of the NAND gate 54. The output terminal of the NAND gate 54 is connected through a buffer 56 to the cathode of a light emitting diode 58, the anode of which is connected to a positive voltage supply terminal.

The input terminal 28b is connected through a coupling resistor 60 to one input terminal of a third comparator amplifier 62. Here, too, a voltage dividing resistor string, composed of resistors 64, 66 and 68, is connected across the zener diode 38. The resistor 66 is, again, a slidewire resistor having an adjustable tap connected to the other input terminal of the comparator amplifier 62. The input terminal 28b is also connected through the resistor 60 to one input terminal of a fourth comparator amplifier 70. A voltage dividing resistor string, composed of resistors 72, 74 and 76, is also connected across the zener diode 38. The output terminal of the comparator amplifier 62 is connected to a first input terminal of a NAND gate 78. The output terminal of the fourth comparator amplifier 70 is connected to the other input terminal of the NAND gate 78. The output terminal of the NAND gate 78 is connected through a buffer 80 to the cathode of a light emitting diode 82, the anode of which is connected to a positive voltage supply terminal.

The input terminal 28a is also connected through a coupling resistor 84 to a first slidewire resistor 86, the other terminal of which is grounded, and a second slidewire resistor 88, the other terminal of which is also grounded. A slider, cooperating with the slidewire resistor 86, is connected through a coupling resistor 90 to a first input terminal of a fifth comparator amplifier 92. The input terminal 28b is connected to a junction point 94 and from thence through a load resistor 96 to ground. The junction 94 is connected through a resistor 98 and a coupling resistor 100 to the other input terminal of the comparator amplifier 92. The junction between the resistors 98 and 100 is also connected through a coupling resistor 102 to one input terminal of a sixth comparator amplifier 104. A slider associated with the slidewire resistor 88 is connected through a coupling resistor 106 to the other input terminal of the comparator amplifier 104. The output terminal of the comparator amplifier 92 is connected to one input terminal of a NAND gate 108. The output terminal of the comparator amplifier 104 is connected to the other input terminal of the NAND gate 108. The output terminal of the NAND gate 108 is connected to a two branched circuit each branch including a buffer 110 and 112, a resistor 114, 116 and a light emitting diode 118, 120. Each branch also includes a switch 122, 124 either or both of which may be closed at the choice of the system operator.

In operation, reference will also be made to FIG. 2. It will be noted that the input terminal 28a (FIG. 4) is connected to the inverting input of the first comparator amplifier 34 and to the non-inverting input terminal of the second comparator 46. The slider associated with the slidewire resistor 42 is connected to the non-inverting input of the comparator 34. That slider is adjusted to provide a bias signal to the non-inverting input of the comparator 34 such as to define the upper edge 30a of the center centimeter 30 illustrated in FIG. 3. Similarly, but conversely, the slider associated with the slidewire resistor 50 is connected to the inverting input of the comparator 46. That slider is adjusted to apply a bias to the comparator 46 such as to define the lower edge 30b of the center centimeter 30, again, illustrated in FIG. 3. Coarse adjustment of the slider associated with the slidewire 20 (FIG. 2) is adjusted to tend to cause the unexcited beam of the cathode ray tube associated with channel 1 to move downward until it approaches the upper edge of the center centimeter. So long as the beam is positioned above the center centimeter, the output of the comparator 34 is a logical "0" or low. The comparator 46 is biased to have an output which is a logical high or "1." As the slider on the slidewire 20 is adjusted to move the beam into the area of the center centimeter 30, the output of the comparator 34 goes high. So long as the position of the beam has not dropped below the lower edge 30b of the center centimeter 30, the output of the comparator 46 remains high. When the output of both comparators is high, the output of the NAND gate 54 goes low. The low at the output of the NAND gate 54 causes the LED 58 to turn on, indicating that the beam of the first channel CRT 2 is within the bounds of the center centimeter. If, of course, the beam were to be biased to be below the level of the lower edge 30b of the center centimeter, the output of the comparator 46 would go low turning off the LED 58. Thus, the LED 58 is illuminated only when the beam of the channel 1 CRT 2 is within the center centimeter 30. The second CRT is similarly adjusted to cause its beam to move into the region of its own center centimeter. When the beam of the second CRT 4 is, indeed, within the center centimeter 30, the output of both comparators 52 and 70 are high causing the output of the NAND gate 78 to be low thereby turning on the LED 82. Thus, the LED 82 is illuminated only when the beam of the second CRT 4 is within the limits of the center centimeter. Thus, when both LED 58 and LED 82 are illuminated, the beams of both tubes are within the limits of the center centimeter. This does not mean, of course, that the beams are in accurate alignment with respect to each other. However, with the beams thus aligned within the center centimeter, the fine adjustment of the slider associated with the slidewire 22 (FIG. 2) may be brought into operation. Using the adjustments of the two slidewires 20 and 22 with regard to the positioning of the beam of the first CRT 2, the beam is arbitrarily positioned at or near the center of the center centimeter. That position and the signal applied to the terminal 28a thereof is used as a reference for the fine positioning of the beam of the second tube 4. The signal at the terminal 28a is applied to the non-inverting input terminal of the comparator 92 and to the converting input terminal of the comparator 104. The sliders associated with the slidewire resistors 86 and 88 are, again, adjusted to provide a narrow band, on the order of 0.005 of an inch, within the center centimeter 30. With the slider associated with slidewire resistor 86 defining the upper limit of that band and the signal at the slider associated with the slidewire 88 defining the lower limit of that band, the signal derived from the second CRT is applied, as previously mentioned, to the input terminal 28b. That signal is applied as input signal to the inverting input of the comparator amplifier 92 and to the non-inverting input of the comparator amplifier 104. The fine adjustment associated with the slidewire 22 of the second channel is then adjusted such that the resulting signal falls between the upper and lower limits established by the sliders 86 and 88. When the signal derived from the second channel CRT, applied to the input terminal 28b, falls between the upper and lower limits, the comparators 92 and 104 will both produce a high output signal causing the output of the NAND gate 108 to go low. The low signal at the output of the NAND gate 104 causes both LED's 118 and 120 to be illuminated, providing both switches 122 and 124 are closed. Thus, if the width of the displacement band determined by the position of the sliders on the two slidewire resistors 86 and 88 is on the order of 0.005 of an inch (5 mils.) then the two line scan traces of the two tubes will be in alignment within 5 mils of each other.

After the two line scan traces have been properly aligned as hereinbefore set forth, the switches 14 (FIG. 2) may now be returned to effect the connection with the input signal terminal 16. Inasmuch as it is anticipated that the twin tube recording apparatus is to be used with the moving record receiving member, a horizontal line trace generated across the face of the two tubes would not produce a horizontal straight line on the record due to the motion of the record. The resulting deviation is known as skew. In order for an analog trace signal generated across the face of the two tubes to be meaningful; means must be provided for compensating for such skew, such compensating means being known as skew correction means. Even in single tube recording apparatus, such skew correction means should be provided. Such a skew correction means is shown in U.S. Pat. No. 3,434,158, Stauffer et al, with particular reference to FIGS. 4, 5 and 6 thereof.

Figure 5:
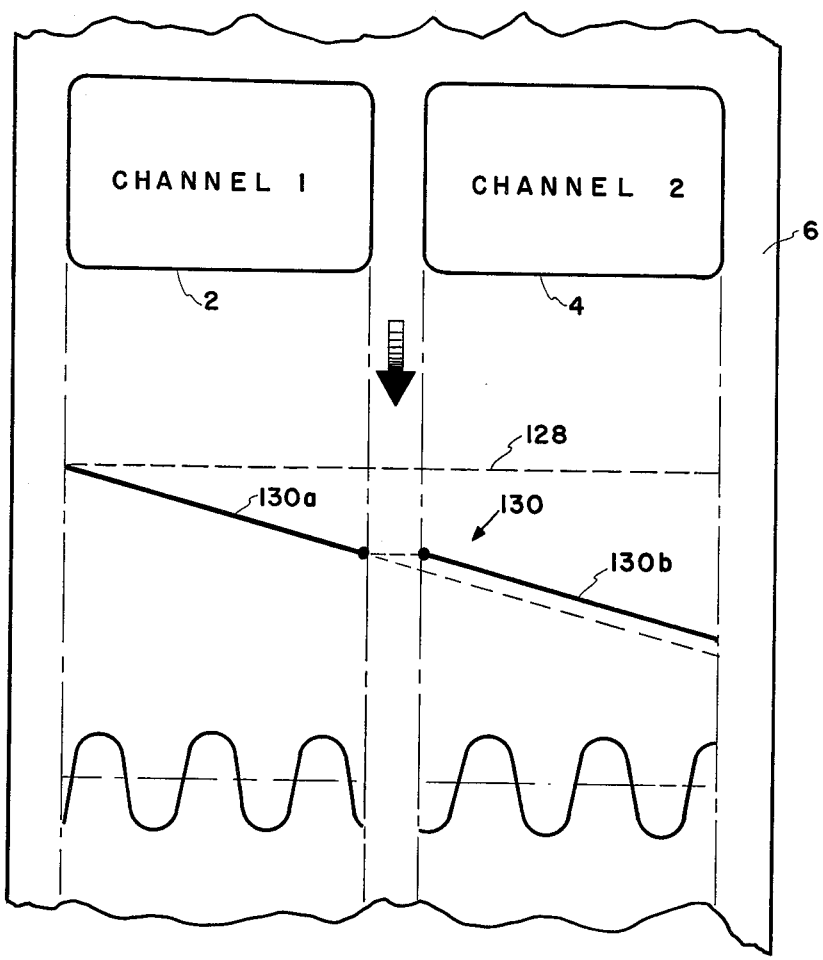
FIG. 5 is a diagram illustrative of relationships and will also be helpful in understanding additional aspects of the present invention.

A special problem appears in connection with providing skew correction for a twin tube operation such as herein described. That special problem is illustrated in FIG. 5. In the single tube type of operation, the skew correction is correlated with the horizontal scan of the cathode ray beam in the tube. Inasmuch as two tubes are being used to produce a trace which is to appear as though it were made by one tube, to accomplish this, it is apparent that the skew correction of the two tubes may not be accomplished on an independent basis. As illustrated in FIG. 5, it may be seen that the skew correction of channel 2 must begin where the skew of channel 1 ends. With particular reference to FIG. 5, channel 1 signal information is represented by the first CRT 2 while channel 2 information is represented by the second CRT 4. Although it is desirable that the two tubes be placed as near as possible to each other in the horizontal direction, it is, of course, necessary that some space be provided between them. These tubes are arranged to provide image data on a chart or record medium 6 which is assumed to be moving in the direction of the arrow 126. If a pair of contiguous line scan traces, not corrected for skew, were to be applied to the two CRT's 2 and 4, a horizontal base line trace would be provided relative to the two tubes. It is apparent that such a trace would not produce a horizontal line across the face of the record member if that record member was, in fact, moving during the time the trace was being generated. It is also apparent that the amount of skew correction needed will be a function of the speed of such chart in its motion past the face of the recording tubes. Inasmuch as the horizontal sweep of the two tubes is slaved such that the horizontal trace of the channel 2 tube begins when the horizontal trace of the first tube ends, the total time reference for a full two tube trace across the width of the chart 6 is the compound sweep time of the two tubes. Whereas each tube is provided with its own sweep and skew control circuits, they must be interrelated to produce effectively a continuous skew correction.

In FIG. 5, such a continuous skew correction is illustrated by the line 130, the skew, of course, being exaggerated for purposes of illustration. The line 130 is composed of two segments, segment 130a being the skew correction for channel 1 and 130b being the skew correction for channel 2. From this it may be seen that the skew correction signal applied to the channel 2 CRT represented by the line 130b has superimposed upon it the last value achieved by the skew correction signal, represented by the line 130a, applied to the tube of channel 1. When these skew correction signals are thus applied, a transverse analog recorder signal will appear in the manner represented by the two lines 130a and 130b as a continuous record trace.

Figure 6:
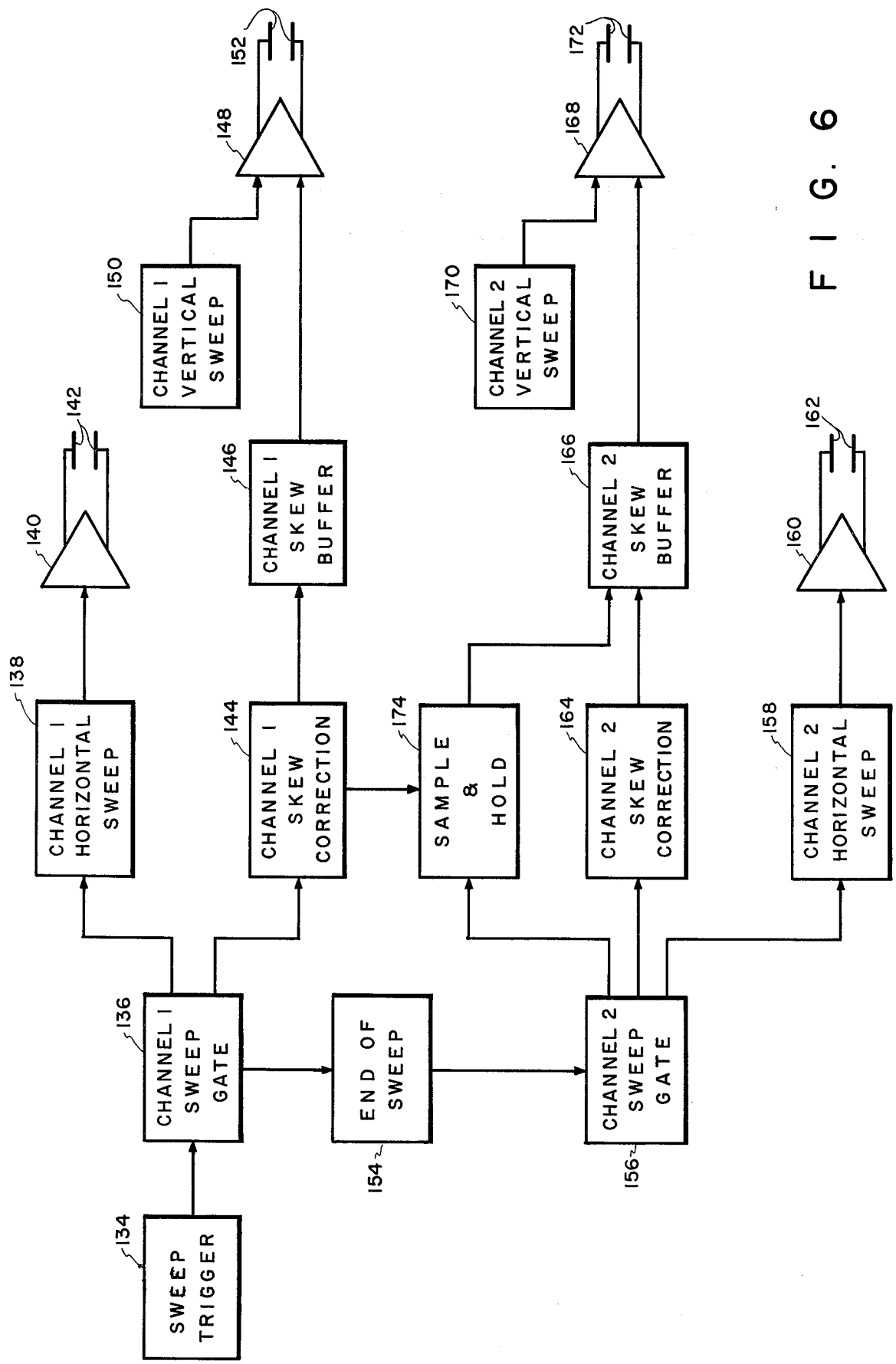
FIG. 6 is a block diagram of circuit relationships embodied in the present invention.

In FIG. 6, there is illustrated in block diagram form a system for accomplishing the correlated skew correction for the two tubes. A sweep trigger generator 134 applies a trigger signal to a channel 1 sweep gate 136. The sweep gate 136, in turn, controls the operation of a channel 1 horizontal sweep circuit 138 which, in turn, supplies the sweep signal for a channel 1 horizontal amplifier 140. The output of the amplifier 140 is applied to the channel 1 horizontal deflection plates 142.

The channel 1 sweep gate 136 also applies an initiating signal to a channel 1 skew correction circuit 144. The skew correction circuit 144 supplies a skew correction signal to a channel 1 skew buffer 146. The output of the channel skew buffer 146 is applied as an input signal to a vertical deflection amplifier 148 for channel 1 where it is combined with the vertical sweep signal from a channel 1 vertical sweep circuit 150. The output of the vertical amplifier 148 is applied to the vertical deflection plates 152 of the channel 1 CRT.

From the channel 1 sweep gate 136, there is derived an end-of-sweep signal which signals the end of the horizontal sweep of the channel 1 CRT. This end-of-sweep signal is applied, by way of an end-of-sweep circuit 154, to trigger a channel 2 sweep gate 156. The channel 2 sweep gate 156 controls the operation of a channel 2 horizontal sweep circuit 158, the output of which is applied as input signal to a channel 2 horizontal deflection amplifier 160. The output of the horizontal deflection amplifier 160 is applied to a pair of horizontal deflection plates 162 of the channel 2 CRT.

As in channel 1, the channel 2 sweep gate triggers a channel 2 skew correction circuit 164. The channel 2 skew correction circuit 164 develops a skew correction signal which is applied as input to a channel 2 skew buffer 166. The output of the skew buffer 166 is applied as input to a channel 2 vertical deflection amplifier 168 where it is combined with a vertical sweep signal from a channel 2 vertical sweep circuit 170. The output of the vertical amplifier 168 is applied to the vertical deflection plates 172 of the channel 2 CRT.

That much of the channel 2 sweep and skew correction circuit is identical to corresponding channel 1 sweep and correction circuits. There is, however, a sample-and-hold circuit 174. The sample-and-hold circuit 174 is gated by the channel 2 sweep gate 156 which, in effect, is the same as the end-of-sweep signal from the end-of-sweep circuit 154. On the occurrence of the end-of-sweep trigger, the sample-and-hold circuit 174 will store a signal which corresponds to the magnitude of the skew correction signal generated in the skew correction circuit 144, at the time of the end of the channel 1 horizontal sweep. That signal from the sample and hold circuit 174 is then superimposed upon the skew correction signal from the correction circuit 164 and applied to the channel 2 skew buffer. Thus, the skew correction signal of channel 2 recording CRT is offset by the amount of the sampled signal and begins at the level of the sample signal from channel 1, thereby producing the continuous skew as illustrated by the line 130 in FIG. 5.

Figure 7:
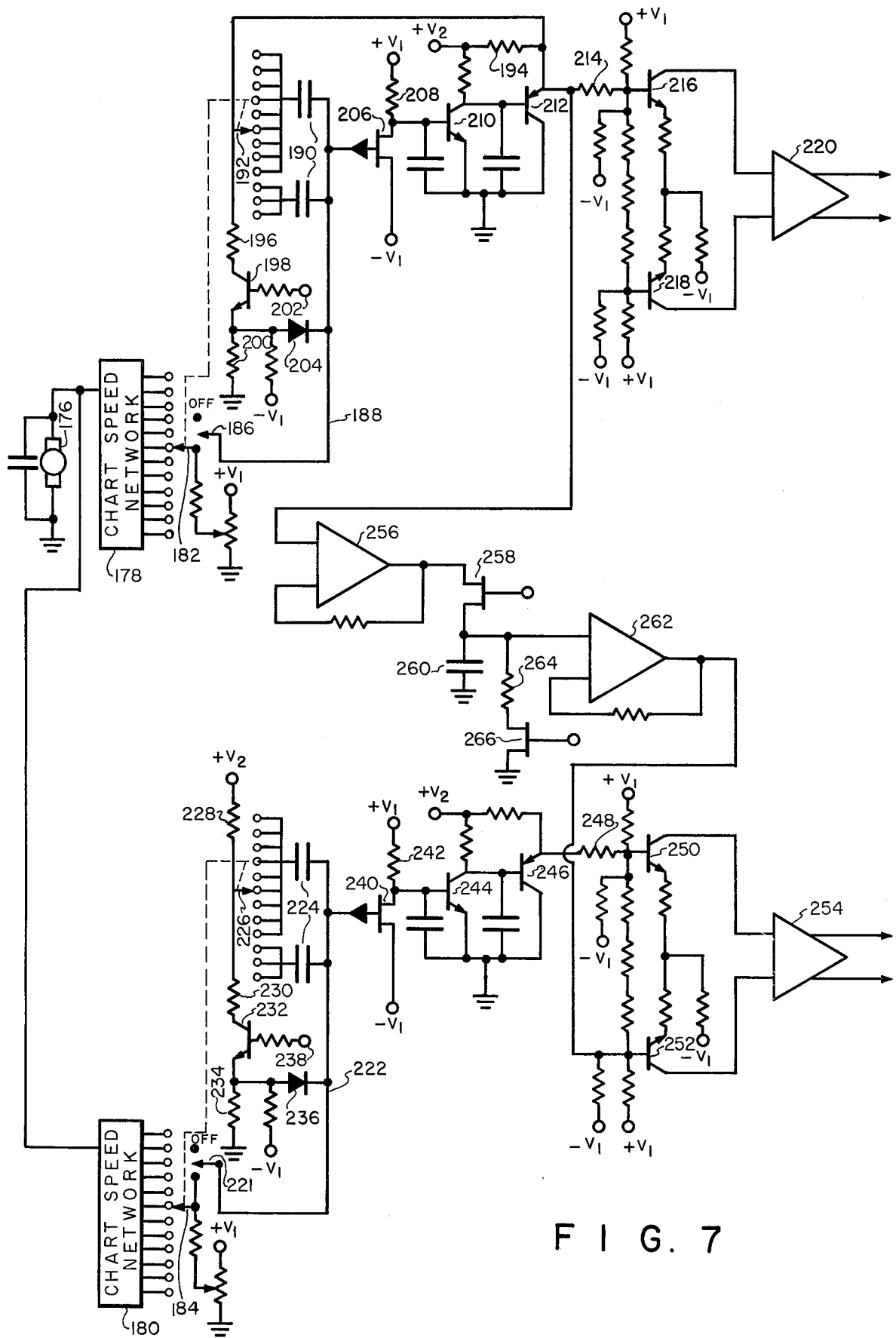
FIG. 7 is a schematic diagram of skew correction circuitry embodying the present invention.

In FIG. 7, there are shown circuit elements for effecting the continuous skew correction discussed in connection with FIG. 6. As was previously mentioned, it is significant that the magnitude of the skew correction should be related to the speed at which the record medium or chart is moving. To this end, a signal proportional to the chart speed is derived by a tachometer generator 176. The d.c. output signal from the tachometer generator 176 is connected as input signal to a first chart speed network 178, associated with the channel 1 recording CRT, and to a second chart speed network 180 associated with the channel 2 recording CRT. Each of the chart speed networks include a plurality of resistor elements selectively arranged to be coupled to a plurality of switch contact points which may be selectively engaged by a movable contact of a switch 182, 184, respectively. The movable contact of the switch 182 is connected through a suitable impedance network to a ground return path for the tachometer generator signal. Similarly, the movable contact of the switch 184 is also connected through a suitable impedance network to the ground return path for the tachometer generator 176. The movable contact of the switch 182 is also connected to a fixed contact of a switch 186, the movable contact of which is connected to a lead 188. A plurality of capacitors 190 have one terminal of each connected to the lead 188. The other terminals of the capacitors are connected to a plurality of fixed switch contact terminals corresponding in number to the contact terminals of the chart speed network 178. A movable contact of the switch 192 is arranged to selectively engage those fixed terminals. The movable contact 192 is connected through a resistor 194 to a positive voltage supply. The movable contact 192 is also connected through a resistor 196, the collector emitter path of a transistor 198 and a resistor 200 to ground. The base of the transistor 198 is connected to a control signal terminal 202. The junction between the emitter of the transistor 198 and the resistor 200 is connected, through a back biased diode 204, to the lead 188. An FET amplifier 206 has its gate electrode connected to the lead 188. The source electrode of the FET 206 is connected through load resistor 208 to a positive voltage source. The drain electrode of the FET 206 is connected to a negative voltage source terminal. The source electrode of the FET 206 is connected to the base electrode of a transistor amplifier 210. The collector of the transistor 210 is connected to the base of a transistor 212. The output of the transistor 212 is taken from the emitter and applied through a resistor 214 to the input of a differential amplifier comprising a pair of transistors 216 and 218. The output of the transistors 216 and 218 apply differentially to the input of a second stage differential amplifier 220. The two differential amplifiers including the transistors 216 and 218 and the differential amplifier 220 comprise the skew buffer 146 shown in FIG. 6. The output of the amplifier 220 is applied as input signal to the vertical amplifier 148 as illustrated in FIG. 6.

The skew correction circuit for the channel 2 recording CRT is substantially identical to that discussed in connection with the channel 1 skew correction circuit. The movable contact of the switch 184 associated with the chart speed network 180 is connected through a switch 221 to a lead 222. A plurality of capacitors 224 have one terminal of each capacitor connected to the lead 222. The other terminals of the capacitors 224 are selectively connected to a plurality of fixed switch terminals comparable in number to the fixed switch terminals of the chart speed network 180. The movable contact on the switch 226 is connected through a resistor 228 to a positive voltage supply terminal. The movable contact of the switch 226 is also connected through a resistor 230, the collector emitter path of a transistor 232 and a resistor 234 to ground. The emitter of the transistor 232 is also connected through a back biased diode 236 to the lead 222. The base of the transistor 232 is connected to a control signal terminal 238.

The lead 222 is connected to the gate electrode of an FET amplifier 240, the source electrode of which is connected through a load resistor 242 to a positive voltage supply terminal. The drain electrode of the FET amplifier is connected to a negative voltage supply terminal. The output of the FET amplifier 240 is taken from the source electrode and connected to the base of a transistor 244. The collector of the transistor 244 is connected to the base of a transistor 246. The emitter of the transistor 246 is connected through a coupling resistor 248 to a differential amplifier comprised of a first transistor 250 and a second transistor 252. The collectors of the two transistors 250 and 252 are connected as differential inputs to a differential amplifier 254. The two differentially connected transistors 250 and 252 together with the differential amplifier 254 correspond to the skew buffer 166 illustrated in FIG. 6. The output of the differential amplifier 254 is connected to the vertical amplifier 168, again, as shown in FIG. 6.

The chart speed network 178 together with the selected one of the capacitors 190 comprise, effectively, an integrating circuit whenever the switch 186 is closed to be in contact with the fixed terminal of the switch 182. Since the input signal to the integrator is a signal derived from the tachometer generator 176, the input signal is a function of the speed with which the chart is being driven past the recording face of the CRT's. It was mentioned that the channel speed network and the integrating capacitors 190 have a plurality of upper terminals connected to fixed contacts of the switches 182 and 192, respectively. The movable contacts of these two switches are ganged together for simultaneous operation with a speed selection switch (not shown) for the chart drive mechanism. Thus, these elements combine to produce a ramp signal, the slope of which is a predetermined function of the chart speed. The terminal 202 is connected to the base of a transistor 198 which is connected to a signal which is effectively an end-of-sweep signal for the horizontal sweep of the channel 1 CRT. When such signal occurs, the transistor 198 is effectively turned on, causing the diode 204 to be forwardly biased, thereby discharging whichever of the capacitors 190 had been selected for inclusion in the integrating network. Thus, a sawtooth signal is provided at the gate electrode of the FET 206, which sawtooth waveform has a period which is determined by the sweep frequency of the horizontal sweep of the CRT and a slope which is a function of the chart speed. That sawtooth wave signal is amplified and shaped by the amplifiers 206, 210 and 212 which, together with the integrator, comprise the channel 1 skew correction circuit 144 illustrated in FIG. 6. The signal developed at the emitter of the transistor 212 comprises the skew correction signal. That skew correction signal is then applied as input to the channel 1 skew buffer 146, the transistor amplifiers 216, 218 and the differential amplifier 220.

The skew signal at the emitter of the transistor 212 is also applied as input signal to an operational amplifier 256. The operational amplifier is a non-inverting, unity gain amplifier. The output of the amplifier 256 is connected to the source electrode of an FET switch 258, the gate electrode of which is connected to a terminal to receive a control signal which is effectively an end-of-sweep signal from the horizontal sweep circuit of channel 1 CRT. The drain electrode of the FET switch 258 is connected to one electrode of a capacitor 260, the other electrode of which is connected to ground. The junction between the drain electrode of the switch 258 and the capacitor 260 is connected, first, to an input terminal of a second operational amplifier 262 and through a resistor 264 to the source electrode of a second FET switch 266, the drain electrode of which is connected to ground. The gate electrode of the FET switch 266 is also connected to a terminal to which a signal indicative of the end-of-sweep for the second channel CRT is applied. The operational amplifier 262 is a unity gain, inverting amplifier, the output of which is connected to the base electrode of the transistor 252. It will be remembered that the transistor 252 is one of the pair of transistors comprising a differential amplifier for buffering the skew signal of the channel 2 CRT. The base electrode of the transistor 252 comprises the reference level for the differential amplifier. Whereas in the channel 1 differential amplifier, the base electrode of the transistor 218 was substantially at zero potential, in the channel 2 buffer amplifier the reference level is established at that potential determined by the output of the amplifier 262. In operation, the FET switch 258 is gated on when the horizontal sweep for the channel 1 CRT reaches the end of its sweep. At that point, the skew correction signal at the emitter of the transistor 212 is applied through the operational amplifier 256 and the switch 258 to be stored on the capacitor 260, the switch 266 being gated off at this point. The signal stored on the capacitor 260, at this point, is substantially at the value of the maximum point of the skew correction signal from the channel 1 skew correction circuit. Substantially simultaneously with the establishment of that signal on the capacitor 260, the channel 2 sweep gate is triggered into operation to begin the horizontal sweep of the second channel CRT. At the same time, the skew correction circuits for the second channel also begins to generate a skew correction signal. Since the signal stored on the capacitor is applied as reference signal to the differential amplifier transistor 252, the skew correction signal for the second channel CRT begins at the level of the signal stored on the capacitor 260. At the end of the channel 2 horizontal sweep, the switch 258 is opened and the switch 266 is closed. The closure of the switch 266 at the end of the channel 2 sweep causes the capacitor 260 to be discharged, thereby resetting the sample and hold circuit.

The switches 186 and 221 are closed on the fixed contacts connected, respectively, to the chart speed networks 178 and 180 when the apparatus is in operation. When, however, the line scan of the two tubes is being aligned, the switches 186 and 221 are switched to the "off" position whereby the skew correction signals will not interfere with the initial alignment of the line scan trace.

Thus, it may be seen that there has been provided, in accordance with the present invention, in a twin tube wide scan CRT recording system, a means for effecting a continuation of the skew correction of the first tube to skew correction of the second tube.

The embodiments of the invention in which an exclusive property or privilege is claimed are defined as follows:

1. A two channel cathode ray tube recording system for recording a wide contiguous trace record on a moving record receiving member, said system comprising
   a first channel cathode ray tube,
   a second channel cathode ray tube,
   a first skew correction means for producing a skew correction signal for said first channel cathode ray tube,
   a second skew correction means for producing a skew correction signal for said second channel cathode ray tube, and
   means interconnecting said first and second skew correction means for offsetting said skew correction signal for said second channel by an amount determined from a selected value of said skew correction signal for said first channel.

2. A two channel cathode ray tube recording system for recording a wide contiguous trace record on a moving record receiving member, said system comprising
   a first channel cathode ray tube,
   a second channel cathode ray tube,
   a first sweep circuit means for producing sweep signals for said first channel cathode ray tube,
   a first skew correction means for producing a skew correction signal for said first channel cathode ray tube, said first skew correction means being synchronized to said sweep signals of said first sweep circuit means,
   a second sweep circuit means for producing sweep signals for said second channel cathode ray tube,
   a second skew correction means for producing a skew correction signal for said second channel cathode ray tube, said second skew correction means being synchronized to said sweep signals of said second sweep circuit means, and
   means interconnecting said first and second skew correction means for offsetting said skew correction signal for said second channel by an amount determined from a selected value of said skew correction signal for said first channel.

3. A two channel cathode ray tube recording system for recording a wide contiguous trace record on a moving record receiving member, said system comprising
   a first channel recording cathode ray tube,
   a second channel recording cathode ray tube,
   a first sweep circuit for producing sweep signals for said first channel cathode ray tube,
   a first skew correction means for producing a skew correction signal for said first channel cathode ray tube, said first skew correction means being synchronized to said sweep signals of said first sweep circuit means,
   a second sweep circuit means for producing sweep signals for said second channel cathode ray tube,
   a second skew correction means for producing a skew correction signal for said second channel cathode ray tube, said second skew correction means being synchronized to said sweep signals of said second sweep circuit means, and
   a sample-and-hold circuit means connected between said first and second skew correction means said sample-and-hold circuit means being controlled to sample said skew correction signal of said first channel at a predetermined time during the sweep signals and to superimpose the sampled signal value on said second skew correction means whereby to offset said skew correction signal for said second channel by the amount of said sampled signal.

4. A two channel cathode ray tube recording system for recording a wide contiguous trace record on a record receiving member moving past said cathode ray tubes at a selected one of a plurality of speeds, said system comprising
   a first and a second channel recording cathode ray tube,
   a first sweep circuit for producing sweep signals for said first channel cathode ray tube,
   a first skew correction means for said first channel cathode ray tube, said first skew correction means including means responsive to the selected speed of movement of the record receiving member for producing first skew correction signals which are a function of said selected speed, and means responsive to said first sweep circuit for synchronizing said first skew correction signals with said sweep signals of said first sweep circuit, a second sweep circuit for producing sweep signals for said second channel cathode ray tube, a second skew correction means for said second channel cathode ray tube, said second skew correction means including means responsive to the selected speed of movement of the record receiving member for producing second skew correction signals which are a function of said selected speed, and means responsive to said second sweep circuit for synchronizing said second skew correction signals with said sweep signals of said second sweep circuit, and a sample-and-hold circuit means connected between said first and second skew correction means, said sample-and-hold circuit means being controlled to sample said first skew correction signal at a predetermined time during the sweep signals and to superimpose the sampled signal value on said second skew correction means whereby to offset said second skew correction signal by the value of said sampled signal.

5. A two channel cathode ray tube recording system for recording a wide contiguous trace record on a record receiving member moving past said cathode ray tubes at a selected one of a plurality of speeds, said system comprising a first and a second channel recording cathode ray tube, a first sweep circuit for producing sweep signals for said first channel cathode ray tube, a first skew correction means for said first channel cathode ray tube, said first skew correction means including means responsive to the selected speed of movement of the record receiving member for producing first skew correction signals which are a function of said selected speed, and means responsive to said first sweep for synchronizing said first skew correction signals with said sweep signals of said first sweep circuit, a second sweep circuit for producing sweep signals for said second channel cathode ray tube, a second skew correction means for said second channel cathode ray tube, said second skew correction means including means responsive to the selected speed of movement of the record receiving member for producing second skew correction signals which are a function of said selected speed, and means responsive to said second sweep circuit for synchronizing said second skew correction signals with said sweep signals of said second sweep circuit, and a sample-and-hold circuit means connected between said first and second skew correction means, said sample-and-hold circuit means including gating means synchronized with the end of said sweep signals for said first channel to sample the value of said first skew correction at the end of each such sweep, means for superimposing said sampled value on said second skew correction means whereby to offset said second skew correction signals by the value of said sample value, and further gating means synchronized with the end of said sweep signals for said second channel for resetting said sample-and-hold circuit means.

* * * * *